(12) United States Patent
Chen et al.

(10) Patent No.: US 7,888,272 B2
(45) Date of Patent: Feb. 15, 2011

(54) METHODS FOR MANUFACTURING MEMORY AND LOGIC DEVICES USING THE SAME PROCESS WITHOUT THE NEED FOR ADDITIONAL MASKS

(75) Inventors: Kuan Fu Chen, Taipei (TW); Yin Jen Chen, Taipei (TW); Tzung Ting Han, Yilan (TW); Ming-Shang Chen, Hsinchu (TW); Shih Chin Lee, Yunlin (TW)

(73) Assignee: Macronix International Co. Ltd. (TW)

( * ) Notice: Subject to any disclaimer, the term of this patent is extended or adjusted under 35 U.S.C. 154(b) by 689 days.

(21) Appl. No.: 11/609,747

(22) Filed: Dec. 12, 2006

(65) Prior Publication Data

US 2008/0138998 A1 Jun. 12, 2008

(51) Int. Cl.
*H01L 21/318* (2006.01)
(52) U.S. Cl. .................. 438/775; 438/766

(58) Field of Classification Search .............. None
See application file for complete search history.

(56) References Cited

U.S. PATENT DOCUMENTS

| | | | |
|---|---|---|---|
| 5,596,218 A * | 1/1997 | Soleimani et al. ........... 257/369 |
| 6,277,689 B1 | 8/2001 | Wong | |
| 6,545,314 B2 | 4/2003 | Forbes et al. | |
| 6,800,830 B2 * | 10/2004 | Mahawili ............... 219/121.41 |
| 6,885,587 B2 | 4/2005 | Yang et al. | |

* cited by examiner

*Primary Examiner*—Zandra Smith
*Assistant Examiner*—Pamela E Perkins
(74) *Attorney, Agent, or Firm*—Baker & McKenzie LLP

(57) ABSTRACT

A semiconductor fabrication process allows the fabrication of both logic and memory devices using a conventional CMOS process with a few additional steps. The additional steps, however, do not require additional masks. Accordingly, the process can be reduce the complexity, time, and cost for fabricating logic and memory devices on the same substrate, especially for embedded applications.

14 Claims, 11 Drawing Sheets

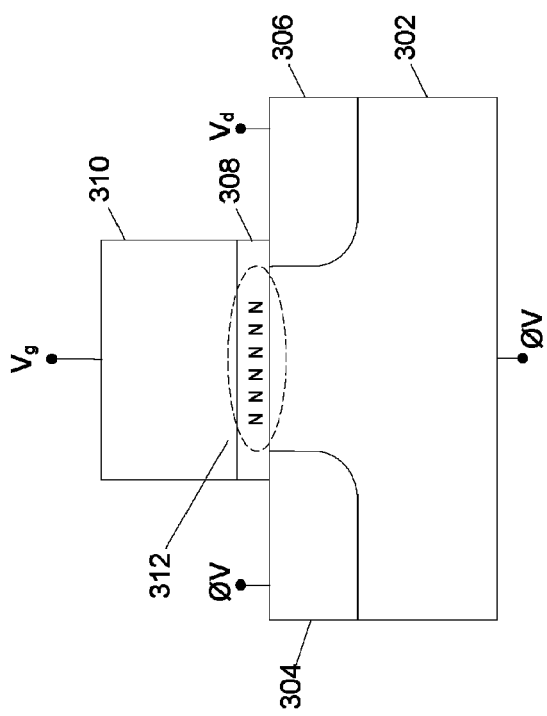
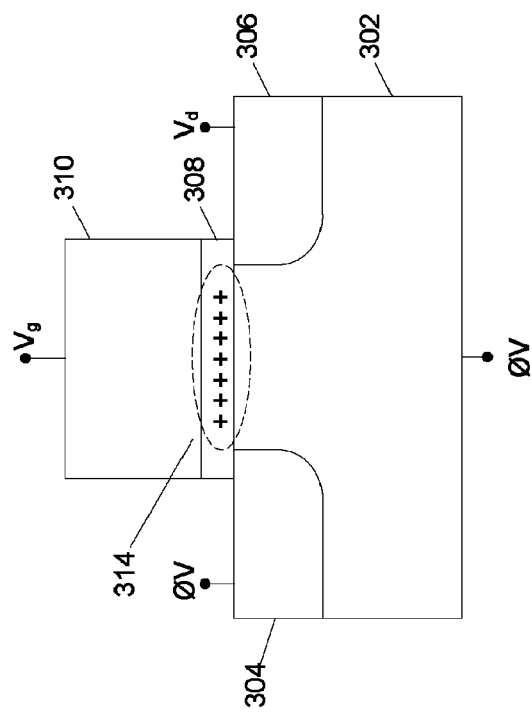

METHODS FOR MANUFACTURING MEMORY AND LOGIC DEVICES USING THE SAME PROCESS WITHOUT THE NEED FOR ADDITIONAL MASKS

BACKGROUND

1. Field of the Invention

The embodiments described herein are directed to non-volatile memory devices, and more particularly to the fabrication of embedded non-volatile memory device and CMOS logic devices using the same fabrication process.

2. Background of the Invention

Many non-volatile semiconductor memories are based on the well known MOS-type structure. In other words, they comprise a gate structure separated from a substrate by a dielectric layer. Diffusion regions are implanted in the substrate under the corners of the gate structure. When the appropriate voltages are applied to the diffusion regions and the control gate, a channel can be created in the upper layers of the substrate between the diffusion regions and under the gate structure. Carriers, e.g., electrons, can travel the channel between the diffusion regions.

If a sufficient field component is present in the direction of the gate structure, the carriers, e.g., electrons, can be attracted to the gate structure. If the electrons have enough energy to overcome the barrier height of the dielectric layer, then these carriers can be injected through the dielectric layer.

An example non-volatile memory device is the Flash memory device. Flash memory has been widely adopted for a number of non-volatile memory applications. Flash devices were originally introduces as a replacement for Ultra Violet (UV) erasable Electrically Programmable Read Only Memory (EPROM). Today, however, Flash has not just taken over large parts of the One Time Programmable (OTP) and EPROM markets, but it has also become a significant competitor for Electrically Erasable Read Only Memory (EEPROM) and even for some Random Access Memory (RAM) applications.

Due to Flash's origin as a EPROM replacement, most Flash designs are based on cells derived from EPROM technology or EEPROM technology. Accordingly, many flash cell concepts have drawbacks, especially with respect to embedded applications. These drawbacks include low programming speed, high power consumption, high programming voltages, over erase problems, soft write problems, and high process complexity.

This later issue can be especially problematic for embedded applications where memory cells are often closely integrated with CMOS logic and other circuitry, because not only are Flash processes complex, they are also typically incompatible with conventional CMOS processes. Accordingly, including Flash in an embedded application can significantly increase fabrication time and cost.

Several new memory types have been introduced with the aim of overcoming the disadvantages of Flash memory listed above, especially with respect to embedded applications; however, most of these new designs are still incompatible with conventional CMOS processes. Some newer designs have been introduced that are somewhat compatible with conventional CMOS techniques; however, even these designs still require several additional masks. Accordingly, even these newer designs have increased complexity, time and costs compared with conventional CMOS processes.

SUMMARY

A semiconductor manufacturing process through which both memory circuits and CMOS logic circuits can be formed without the need for additional masks. A conventional CMOS process flow can be used to form both the CMOS logic circuits and the memory circuits. The memory circuits require additional processing steps, but these additional steps do not require additional mask, thereby greatly reducing the complexity, time and costs for manufacturing embedded circuits.

In one aspect, methods for operating a non-volatile memory device made using the methods described herein is provided.

These and other features, aspects, and embodiments of the invention are described below in the section entitled "Detailed Description."

BRIEF DESCRIPTION OF THE DRAWINGS

Features, aspects, and embodiments of the inventions are described in conjunction with the attached drawings, in which:

FIGS. 6A-6B are diagrams illustrating example processes for reading the device of FIG. 3;

DETAILED DESCRIPTION

The embodiments described below are directed to non-volatile memory and CMOS devices made using a conventional CMOS process flow with the addition of a few processing steps that do not require additional masks. Certain embodiments described herein are related to embedded applications; however, it will be understood that the embodiments described herein are not limited to embedded applications.

It will be understood that any dimensions, measurements, ranges, test results, numerical data, etc., are approximate in nature and unless otherwise stated not intended as precise data. The nature of the approximation involved will depend on the nature of the data, the context and the specific embodiments or implementations being discussed.

Figure 1A:
FIGS. 1A-1F are cross-sectional, schematic diagrams illustrating an example of progression of steps for fabricating a non-volatile memory device in accordance with one embodiment.
Figure 1B:
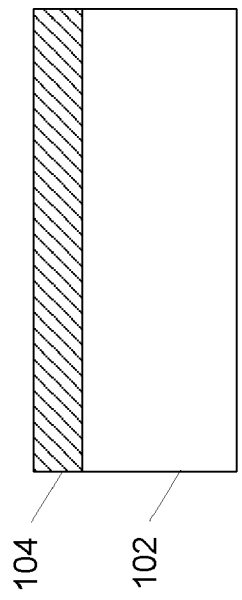

FIGS. 1A-1F are cross-sectional, schematic views illustrating the progressions of steps for fabricating a device in accordance with one embodiment. As explained in more detailed below, the steps illustrated in FIGS. 1A-1F can be performed as part of a conventional CMOS process without the need for additional masks. The process starts with the substrate 102 as illustrated in FIG. 1A. As describe below, substrate 102 can be a P-type substrate or an N-type substrate depending on the device being fabricated. Further, substrate 102 can comprise an N-well or a P-well depending on the particular device being fabricated. As illustrated in FIG. 1B, an oxide layer 104 is then grown on substrate 102. For example, oxide layer 104 can comprise a thickness of between approximately 10 Å and 100 Å. Oxide layer 104 can act as a buffer layer between substrate 102 and silicon nitride layer 106 shown in FIG. 1C. For example, oxide layer 104 can be a silicon dioxide layer ($SiO_2$) grown via thermal oxidation of substrate 102.

Figure 1C:
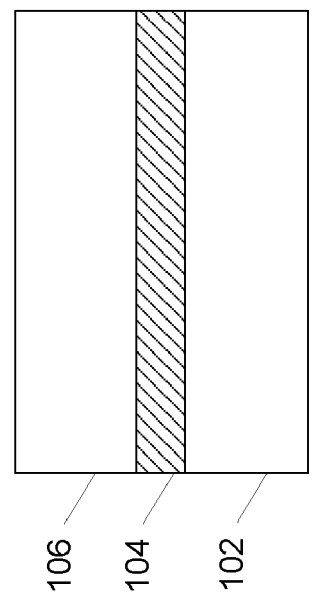

Next, as illustrated in FIG. 1C, silicon nitride (SiN) layer 106 can be formed over oxide layer 104. For example, SiN layer 106 can be deposited on top of oxide layer 104 using Chemical Vapor Deposition (CVD).

Figure 1D:
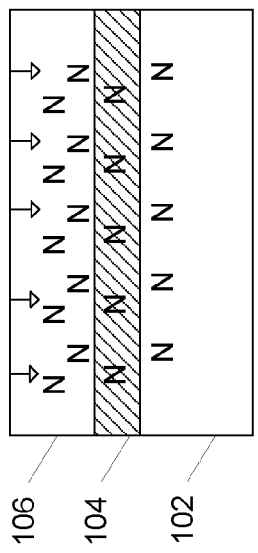
Figure 1E:
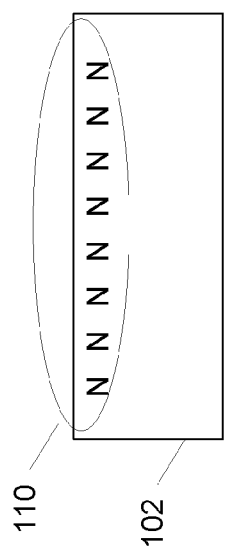

In FIG. 1D, a high thermal treatment can then be applied. For example, the thermal treatment can comprise application of a temperature of between approximately 800° C. and 1200° C. for, e.g., a duration of between approximately 30 minutes to 2 hours. The high thermal treatment will cause some nitrogen (N) or SiN atoms 108 to migrate through oxide layer 104 into substrate 102 as illustrated in FIG. 1D. As illustrated in FIG. 1E, oxide layer 104 and SiN layer 106 can then be removed, i.e., using a wet and/or dry etching processes. This will leave substrate 102 with a plurality of N or SiN atoms 110 in the upper layer of substrate 102.

Figure 1F:
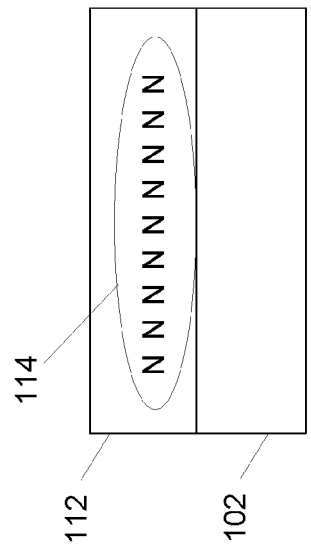

Next, as illustrated in FIG. 1F, a gate oxide layer 112 can be grown on substrate 102. For example, as with oxide layer 104, oxide layer 112 can be grown on substrate 102 via thermal oxidation of substrate 102. Oxide layer 112 can have a thickness in the range of approximately 50 Å to 250 Å.

Oxide layer 112 can actually be used to form the gate oxide for the memory device ultimately being fabricated. Thus, the step illustrated in FIG. 1F can actually comprise part of a conventional CMOS fabrication processes as described in more detail below. During the growth of oxide layer 112, however, the N or SiN atoms 110 in substrate 102 (see FIG. 1E) can migrate into oxide layer 112 as illustrated in FIG. 1F. These N or SiN atoms 110 will form deep hole traps 114 in oxide layer 112 as described in more detail below.

Figure 2A:
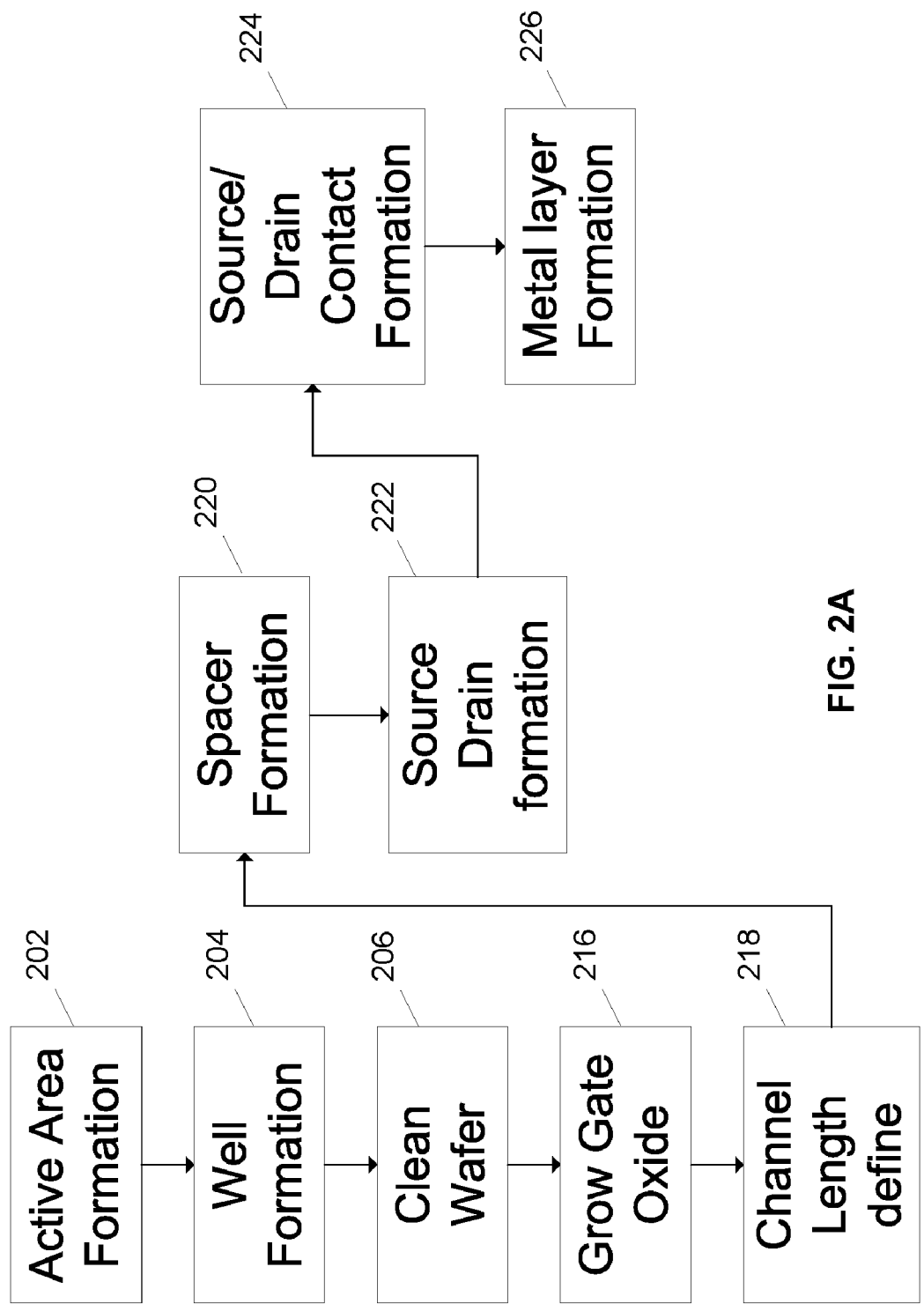
FIG. 2A is a flow chart illustrating the steps for fabricating a CMOS logic device.

FIG. 2A is a flowchart illustrating example steps for a conventional CMOS process. As will be understood, a conventional CMOS process starts with a silicon substrate, this substrate will be either of N-type or P-type substrate. In step 202, active areas for various devices are formed in the substrate. For example, embedded applications will often use Shallow Trench Isolation (STI) processes to define the active areas for various devices due to the high density and compact size requirements of embedded applications.

Well formation can then be performed in step 204. It would be understood that CMOS technology requires that both N-channel (NMOS) and P-channel (PMOS) transistors be built on the same chip substrate. To accommodate both NMOS and PMOS devices, special regions must be created in the substrate of a type opposite to the substrate type. For example, a P-well can be created in an N-type substrate or an N-well can be created in a P-type substrate. In an N-well CMOS process, an NMOS transistors is created in a P-type substrate, while a PMOS transistor is created in an N-well built into the P-type substrate. In certain application, both N-well and P-wells can be used in the same process.

The N-wells and/or P-wells are formed by impurity implantation into the substrate. Accordingly, in step 204, the N-wells and/or P-wells can be defined using conventional photolithography techniques and then the N-wells and P-wells can be implanted into the substrate in the defined areas.

Next, in step 216, a gate oxide layer can be grown on the substrate. In a conventional CMOS process, the substrate is first cleaned in step 206 and then the gate oxide layer can be grown, e.g., via thermal oxidation of the substrate. Next, in step 218, the channel length for the device can be defined. The channel length is defined by depositing a polysilicon layer over the gate oxide layer grown on the substrate. The polysilicon layer is then patterned using conventional photolithography techniques, for example, the polysilicon layer can be deposited via CVD. The defined polysilicon layer and gate oxide layer are then etched, e.g., using dry and/or wet etching techniques, in order to form a gate electrode, formed from the etched polysilicon layer, separated from the substrate via a gate oxide, formed from the etched gate oxide layer.

As will be understood, the etching of the gate polysilicon and gate oxide will leave a portion of the substrate exposed. The portions of the substrate that are exposed will form the source and drain junctions for the device, thus defining the channel length for the device.

Before the source and drain regions are formed however, spacers can be formed on the sides of the gate structure, in step 220, by depositing a spacer oxide, defining the spacer oxide using conventional photolithography techniques, and then etching the defined spacer oxide. Once, the spacers are formed, the source and drain regions can be formed, in step 222, by doping the exposed substrate surface with high concentration of impurities, either N+ type impurities or P+ type impurities, using either diffusion or ion implantation, followed by annealing, e.g., Rapid Thermal Processing (RTP) annealing.

The source and drain interconnects can then be fabricated in step 224. For example, an oxide layer can be formed over the substrate and then patterned using conventional photolithography techniques, the patterned oxide layer can then be etched in order to provide contact windows for the drain and source junctions. The drain and source interconnects can then be formed in the contact windows, e.g., using a self-aligned silicide process. Finally, a metal layer can be patterned and etched, completing the interconnection of the Device on the surface in step 226. It will be understood, that step 226 can actually comprise the formation of a plurality of metal layers as required by a specific application.

Accordingly, the process of FIG. 2A can be used to form CMOS logic devices. The process in FIG. 2B, however, can be used to form both CMOS and memory devices in the same device. As can be seen, steps 202, 204, 206, and 216-226 are the same as for the CMOS process illustrated in FIG. 2A. The process in FIG. 2B, however, includes additional steps 208-214. These steps correspond to the steps illustrated in FIGS. 1A-1E. Thus, after the wells are formed in step 204, the surface of the substrate can be cleaned in step 206 and an oxide layer, e.g., oxide layer 104, can be formed over the substrate in step 208. A SiN layer, e.g., SiN layer 206, can be deposited over the oxide layer in step 210. A high thermal treatment can then be applied in step 212, which can cause N or SiN atoms from the SiN layer to migrate into the substrate. The oxide and SiN layers formed in steps 208 and 210 can then be removed, e.g., via etching, in step 214. The surface of the substrate can then be cleaned and a gate oxide layer can be grown in step 216. As illustrated in FIG. 1F, the N or SiN atoms that had migrated into the substrate can then migrate into the oxide layer during the oxide growth process where they were formed traps 114.

Figure 2B:
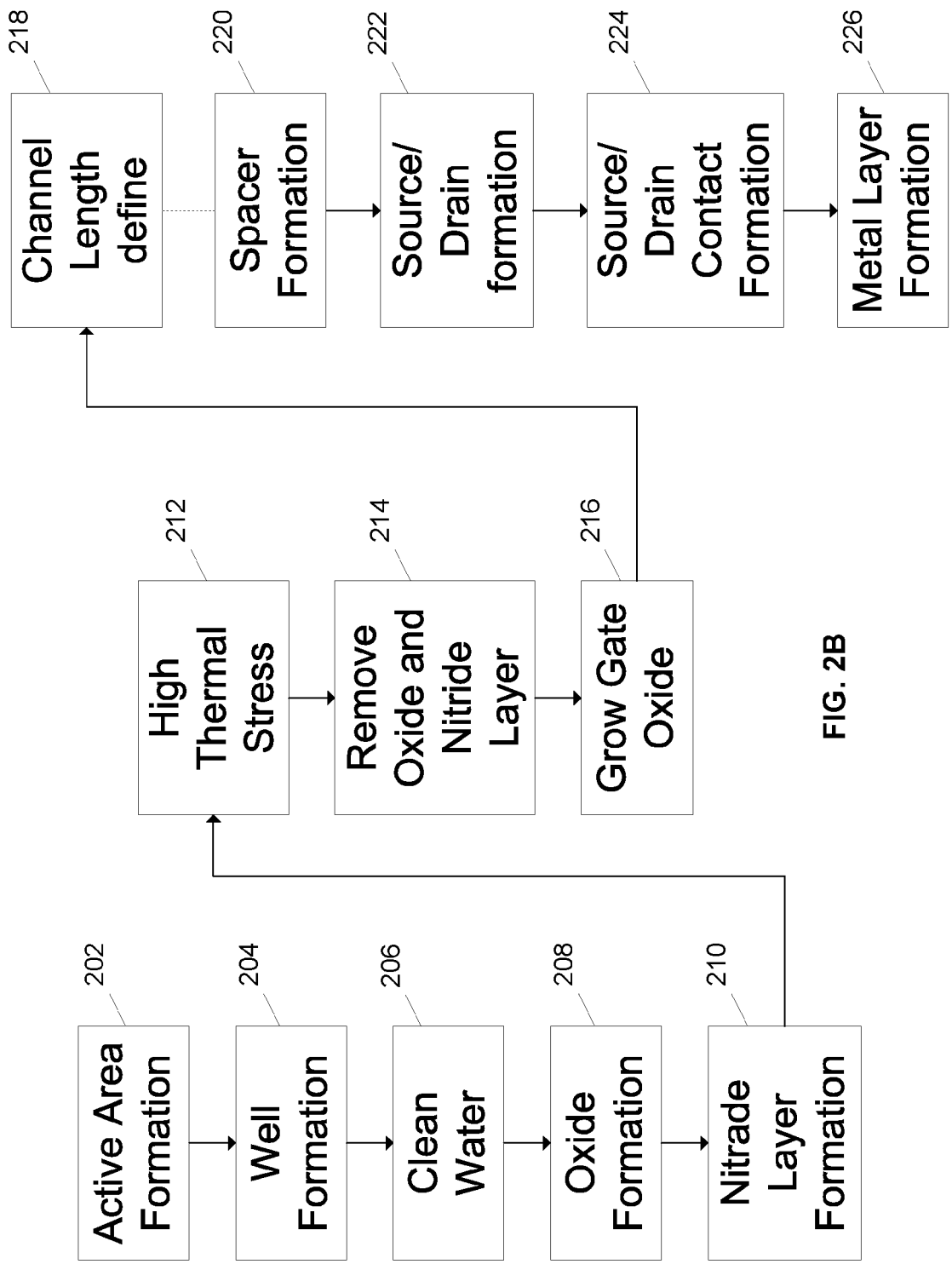
FIG. 2B is a flowchart illustrating an example process for fabricating a non-volatile memory or CMOS device in accordance with one embodiment.

As can be seen in FIG. 2B, the additional steps illustrated in FIGS. 1A-1F do not require any additional masks relative to the CMOS process illustrated in FIG. 2A. Accordingly, with the addition of the few steps illustrated in FIG. 2B and no additional masks, the same process can be used to form the CMOS logic devices and memory devices, i.e., a device fabricated using the process of FIG. 2B can be operated as either a CMOS device or a memory device depending on the biases applied during operation. This is explained in more detail below. The ability to create a device that can operate as either a CMOS device or a memory device can greatly reduce the complexity, time, and costs, especially for embedded applications.

Figure 3:
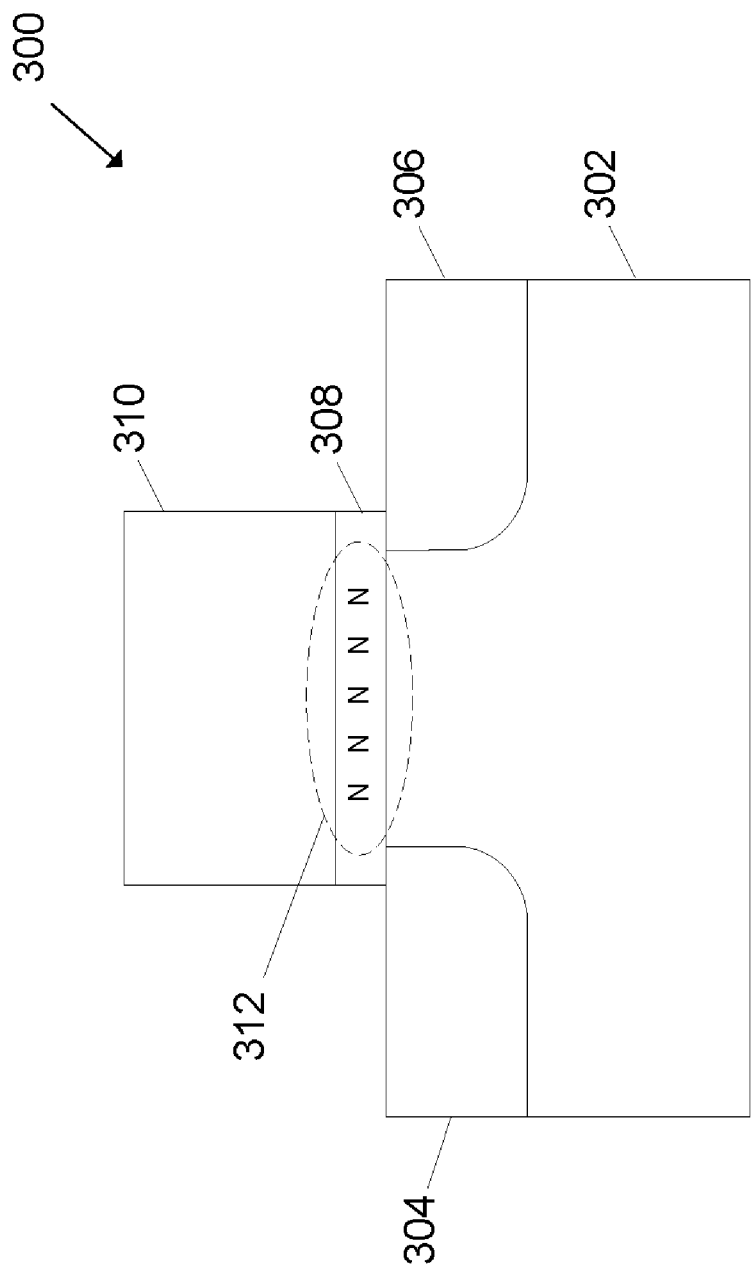
FIG. 3 is a diagram illustrating a device fabricated in accordance with the steps illustrated in FIGS. 1A-1F and in FIG. 2.

FIG. 3 is diagram illustrating a device 300 fabricated in accordance with the process illustrated in FIG. 2. As can be seen, device 300 comprises source and drain regions 304 and 306 formed in substrate 302. An oxide layer 308 comprising N or SiN atoms 312 is formed over the substrate between source and drain regions 304 and 306. A gate electrode 310 is formed over gate oxide 308.

N or SiN atoms 312 can provide uniform hole traps throughout oxide layer 308 in memory applications, which is good for memory applications in general. Further, the traps are deep hole traps so that once trapped, holes cannot easily escape under small electric field, which is good for non-volatile memory applications. In other words, the N or SiN atoms 312 are only active traps in high vertical electric fields, which means that there is less disturbance during normal CMOS operation which is good for CMOS logic devices. Accordingly, the process illustrated in FIG. 2 can be used to form either memory devices or CMOS logic devices using the same process, without any additional masks relative to a conventional CMOS process. Further, the process can be easily integrated into a standard CMOS logic process.

Accordingly, device 300 in FIG. 3 can be operated as a CMOS logic device in accordance with conventional CMOS operating principles by applying the appropriate biases for CMOS operation. Because the voltages used in CMOS operation will not produce a sufficient electric field to activate nitrogen traps 312 in the gate oxide layer, N or SiN atoms 312 will not effect CMOS logic operation. But in addition, device 300 can be operated as a memory device by applying the appropriate biases, i.e. biases that will activate N or SiN atoms 312.

Figure 4:
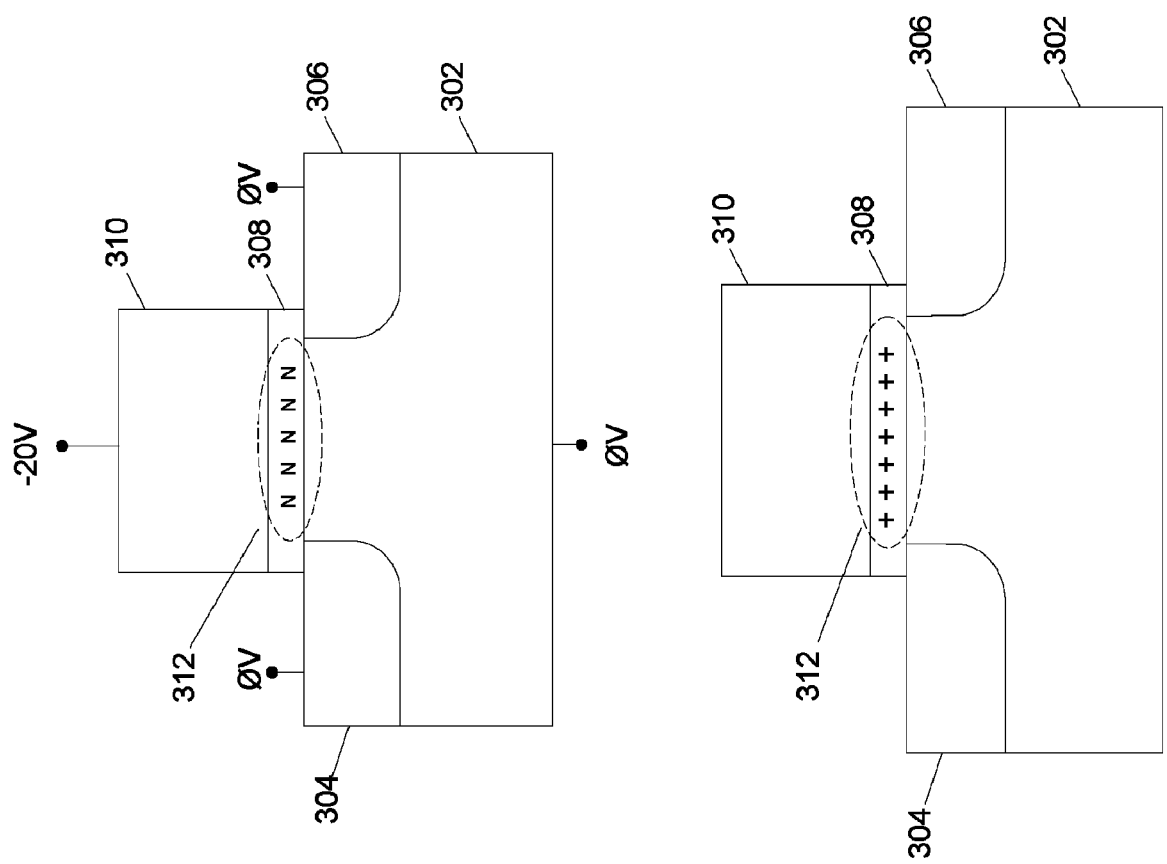
FIG. 4 is a diagram illustrating an example method for programming the device of FIG. 3.
Figure 5:
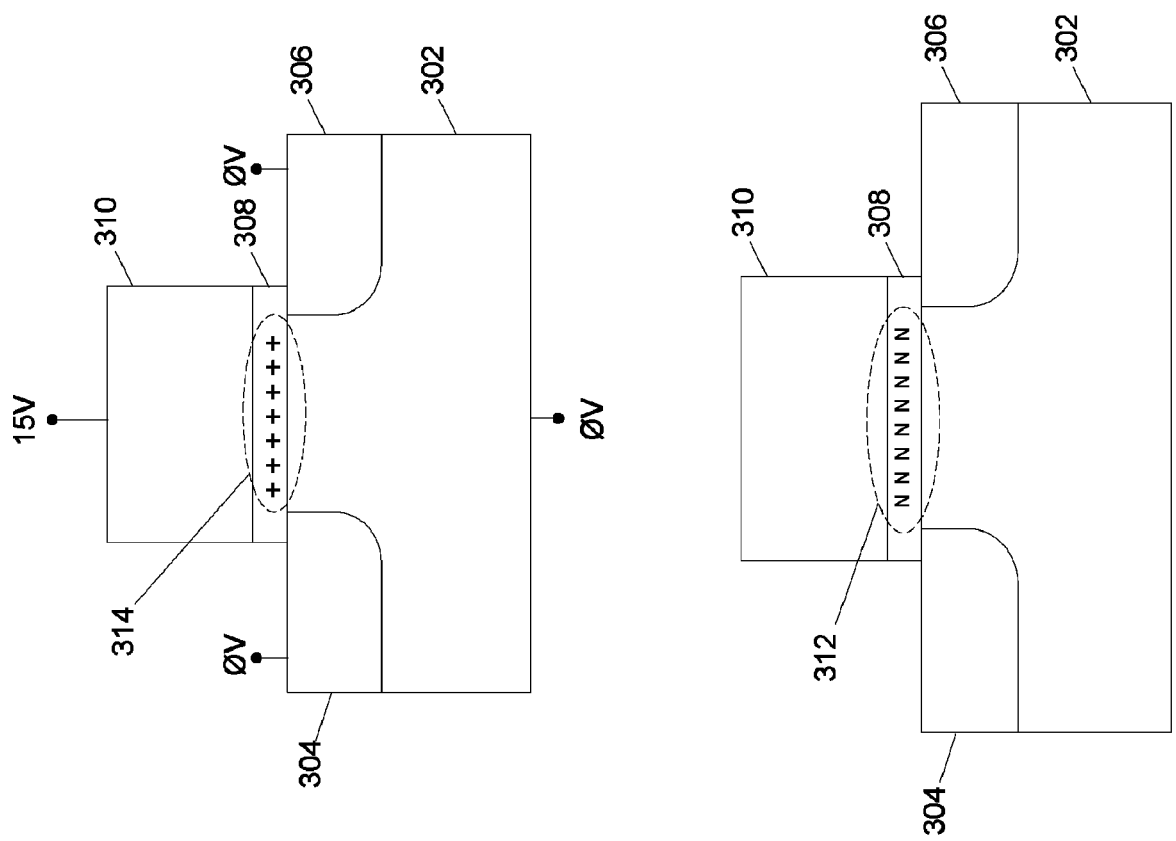
FIG. 5 is a diagram illustrating an example method for erasing the device of FIG. 3.

FIGS. 4 and 5 are diagrams illustrating methods for programming and erasing device 300 when it is used as a memory device. When operating as a memory device, N or SiN atoms 312 act as deep hole traps in oxide layer 308. By creating a large negative, vertical electric field holes can be created that can be trapped in nitrogen traps 312. In order to create the large, negative vertical electric field, a large negative voltage can be applied to gate electrode 310 as illustrated in FIG. 4. In the example of FIG. 4, a voltage of approximately −20 Volts is applied to gate electrode 310. Substrate 302, source 304, and drain 306, can all be tied to 0 volts.

The voltages applied to an NMOS device as illustrated in FIG. 4 will create large, negative vertical electric fields between gate 310 and substrate 302, source 304, and drain 306. The large, negative electric fields can result in holes being trapped in nitrogen traps 312 by one of two possible mechanisms. The first mechanism is tunneling, where holes accumulate near the interface between gate 310 and substrate 302 due to the large negative electric fields across gate 310 and substrate 302. Some holes will then Fowler-Nordheim tunnel from substrate 302 to nitrogen traps 312 where they will trapped. The second mechanism is Anode hot holes injection. Here, excess holes can also be generated by high energy electrons tunneling from gate 310 into substrate 302, which can produce excess holes via high energy impact ionization. The large, negative electric field can then provide enough energy to these minority carriers to allow them to tunnel into oxide layer 308, where they will be trapped by nitrogen traps 312. Accordingly, device 300 can be programmed, i.e., holes can be trapped in nitrogen traps 312, via Fowler-Nordheim hole tunneling and anode hot hole injection. As illustrated in the bottom half of FIG. 4, a program device will have trapped positive charges 314.

It will be understood that the voltages described in relation to FIG. 4 are by way of example only and that the actual voltages will depend on the requirements of a particular application. For example, while a voltage of −20 Volts for the gate electrode is described above, the actual voltage can be in the range of −15 to −30 Volts.

As illustrated in FIG. 5, trapped hole charges 314 can be de-trapped by creating a large, positive electric field between gate 310 and substrate 302. The large, positive electric field will allow trapped holes 314 to escape back into substrate 302. Thus, as illustrated in the bottom half of FIG. 5, device 300 can be erased by applying the large, positive electric field illustrated in the top half of FIG. 5, which will cause trap hole charges 314 to escape back into substrate 302 leaving nitrogen traps 312 in gate dielectric 308.

In the example of FIG. 5, a large positive voltage of approximately 15 Volts is applied to gate electrode 310, while the substrate and source and drain diffusion regions are tied to 0 Volts. It will be understood, however, that the voltages described in relation to FIG. 5 are by way of example only and that the actual voltages will depend on the requirements of a particular application. For example, while a voltage of 15 Volts for the gate electrode is described above, the actual voltage can be in the range of 10 to 20 Volts.

FIGS. 6A and 6B illustrate a read operation for device 300 when it is used as a memory device. As illustrated in FIGS. 6A and 6B, a read voltage can be applied to gate electrode 310 and a read voltage can also be applied to drain 306. Substrate 302 and source 304 can be tied to 0 volts. The gate bias (Vg) and drain bias (Vd) for the read operation should be set so as to produce a large current when the device is programmed, i.e., the threshold voltage (Vt) is lower due to the presence of trapped holes, and a lower current when the device is not programmed, i.e., the Vt is higher due to an absence of trapped holes. At the same time, the gate bias (Vg) should not disturb the program state. Accordingly, Vg should be higher than Vt, but lower than the gate bias applied for program and erase operations.

As illustrated in FIG. 6A, if device 300 is erased, i.e., holes are not trapped in nitrogen traps 312, then application of the read voltages will produce a small current (Ids) between drain 306 and source 304, which will be indicative of an erased device. As illustrated in FIG. 6B, if holes 314 are trapped in gate dielectric layer 308, then application of the read voltages will produce a larger Ids, which can be indicative of a programmed device. Accordingly, device 300 can be configured to store one bit, i.e., a "0" or a "1" For example, the erase state can be associated with a "0" state and the programmed state can be associated with a "1" state.

Figure 7:
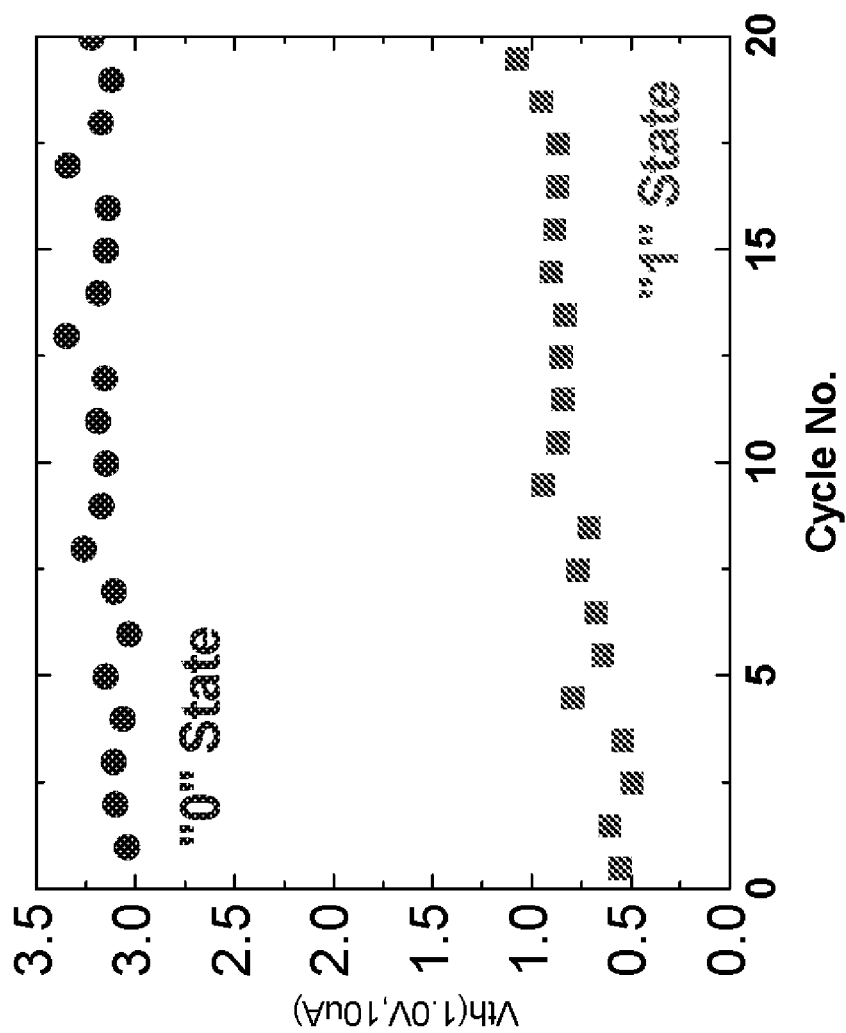
FIG. 7 is a graph illustrating the endurance for a non-volatile memory device configured in accordance with the processes illustrated in FIGS. 1A-1F and FIG. 2.
Figure 8:
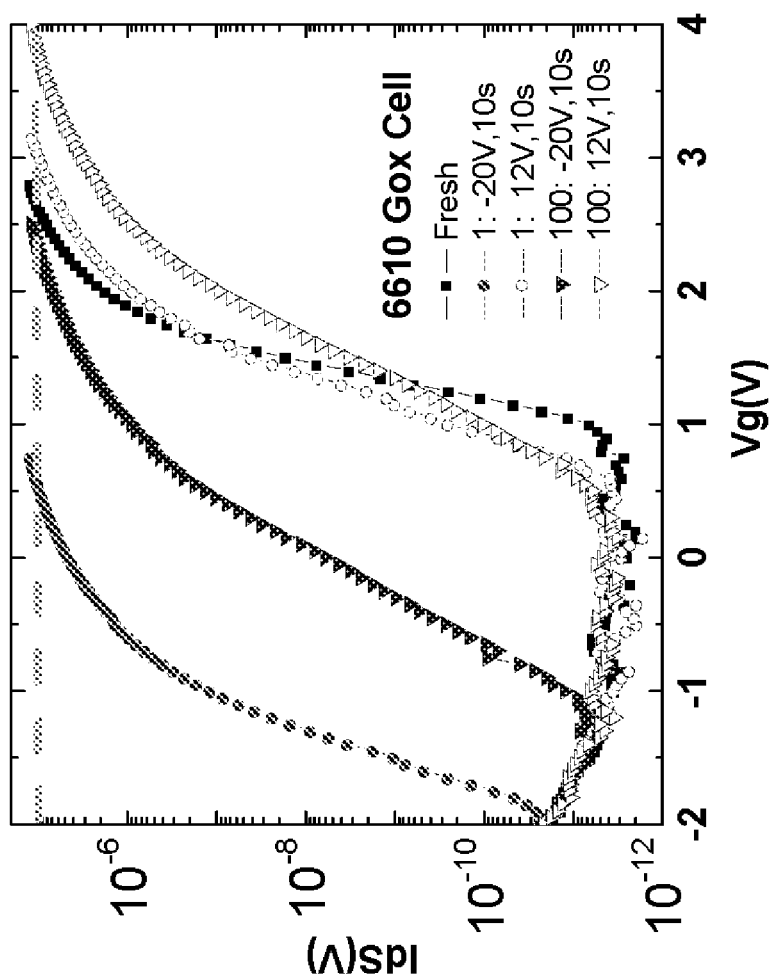
FIG. 8 is a diagram illustrating a current-voltage (IV) curve for a non-volatile memory device fabricated in accordance with the processes illustrated in FIGS. 1A-1F and FIG. 2.
Figure 9:
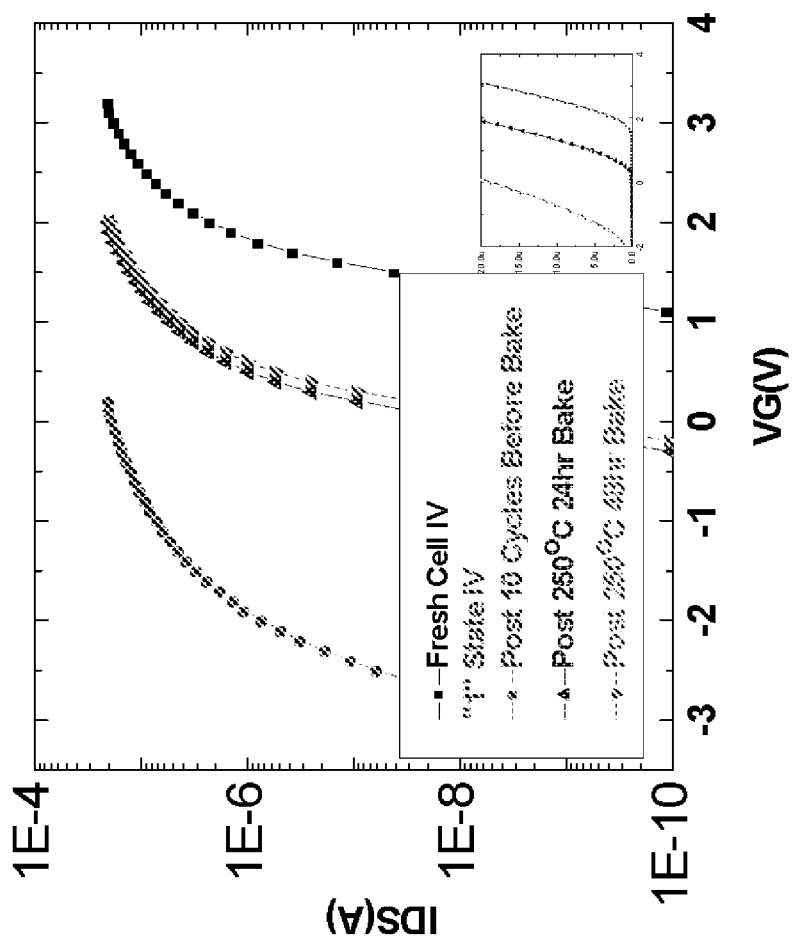
FIG. 9 is a diagram illustrating data retention for a non-volatile memory device configured in accordance with the processes illustrated in FIGS. 1A-1F and FIG. 2.

As illustrated in FIGS. 7-9, the threshold voltage of device 300 is changed when holes 314 are trapped in gate dielectric 308. This change in threshold voltages results in the different Ids produced when the read voltages are applied to device

300. Thus, for example, device 300 can have a threshold voltage of approximately 0.5 volts for the "1" state and approximately 3.0 volts for the "0" state.

It will be understood that the threshold voltage levels described above are by way of example only and should not be seen as limiting the devices described herein to any particular threshold voltage levels.

As illustrated in FIGS. 7 and 9, device 300 exhibits very good endurance over a number of cycles and also very good retention of its programmed state. Because device 300 can withstand the stress of multiple cycles, device 300 can be used for multi-times programmable (MTP) applications in addition to OTP applications. The IV curve for an example device 300 is illustrated in FIG. 8.

Accordingly, the embodiments described herein results in a process that can be used for both CMOS logic and memory devices, which can greatly reduce the time, cost, and complexity for fabricating, e.g., embedded applications. Further, memory devices produced in accordance with the embodiments described herein exhibit good endurance and data retention, which makes them suited for both OTP and MTP applications.

While certain embodiments of the inventions have been described above, it will be understood that the embodiments described are by way of example only. Accordingly, the inventions should not be limited based on the described embodiments. Rather, the scope of the inventions described herein should only be limited in light of the claims that follow when taken in conjunction with the above description and accompanying drawings.

What is claimed is:

1. A method for fabricating both logic and non-volatile memory devices, comprising:

forming an oxide layer on a substrate;

forming a nitride layer on the substrate;

applying a high thermal treatment sufficient to cause at least some nitrogen atoms to migrate from the nitride layer to the substrate;

removing the nitride and oxide layers; and growing a gate oxide layer over the substrate, wherein growing the gate oxide layer causes the nitrogen atoms trapped in the substrate to migrate into the gate oxide layer.

2. The method of claim 1, wherein the thermal treatment comprises application of a temperature of between approximately 800° C. and 1200° C.

3. The method of claim 2, wherein the temperature is applied for between approximately 0.5 hours an 2 hours.

4. The method of claim 3, wherein the oxide layer comprises a thickness in the range of approximately 10 Å and 100 Å.

5. The method of claim 1, wherein forming the oxide layer comprises growing the oxide layer via thermal oxidation of the substrate.

6. The method of claim 1, wherein growing the gate oxide layer comprises growing the gate oxide layer via thermal oxidation of the substrate.

7. The method of claim 6, wherein the gate oxide layer comprises a thickness in the range of approximately 50 Å and 250 Å.

8. The method of claim 1, further comprising forming an active area in the substrate.

9. The method of claim 8, wherein forming an active area comprises forming an active area using a shallow trench isolation process.

10. The method of claim 1, further comprising forming well regions in the substrate.

11. The method of claim 1, further comprising defining a channel length for the logic or memory device.

12. The method of claim 1, further comprising forming diffusion regions in the substrate for the logic or memory device.

13. The method of claim 1, further comprising forming drain and source contacts for the logic or memory device.

14. The method of claim 1, further comprising forming a metal interconnect layer.

* * * * *